(12) United States Patent
Rachmady et al.

(10) Patent No.: US 8,441,074 B2
(45) Date of Patent: May 14, 2013

(54) SUBSTRATE FINS WITH DIFFERENT HEIGHTS

(75) Inventors: Willy Rachmady, Beaverton, OR (US); Justin S. Sandford, Tigard, OR (US); Michael K. Harper, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/837,321

(22) Filed: Jul. 15, 2010

(65) Prior Publication Data

US 2010/0276756 A1 Nov. 4, 2010

Related U.S. Application Data

(63) Continuation of application No. 12/215,778, filed on Jun. 30, 2008, now abandoned.

(51) Int. Cl.
*H01L 29/66* (2006.01)

(52) U.S. Cl.
USPC ............... 257/365; 257/369; 257/E27.062; 257/E29.264

(58) Field of Classification Search ............ 257/365, 257/369, E27.062, E29.264
See application file for complete search history.

(56) References Cited

U.S. PATENT DOCUMENTS

| 7,196,372 B1 | 3/2007 | Yu et al. |
| 7,279,997 B2 | 10/2007 | Kalpat et al. |
| 2004/0222477 A1 | 11/2004 | Aller et al. |
| 2005/0215014 A1 | 9/2005 | Ahn et al. |
| 2006/0081895 A1 | 4/2006 | Lee et al. |
| 2007/0257319 A1 | 11/2007 | Xiong et al. |
| 2007/0259501 A1 | 11/2007 | Xiong et al. |
| 2008/0121998 A1 | 5/2008 | Kavalieros et al. |
| 2008/0128797 A1 | 6/2008 | Dyer et al. |
| 2008/0157131 A1 | 7/2008 | Singh et al. |
| 2008/0237751 A1 | 10/2008 | Shah et al. |
| 2008/0265338 A1 | 10/2008 | Yu et al. |
| 2009/0206374 A1* | 8/2009 | Anderson et al. ............ 257/270 |

FOREIGN PATENT DOCUMENTS

WO 2010/002702 A2 1/2010

OTHER PUBLICATIONS

International Preliminary Report on Patentability received for PCT Application No. PCT/US2009/048683, mailed on Jan. 13, 2011, 8 pages.
International Search Report and Written Opinion received for PCT Application No. PCT/US2009/048683, mailed on Feb. 9, 2010, 12 pages.
Office Action Received for Taiwan Patent Application No. 98121883, Mailed on Aug. 1, 2012, 13 pages of Office Action including 5 pages of English Translation.

* cited by examiner

*Primary Examiner* — Zandra Smith
*Assistant Examiner* — Marvin Payen
(74) *Attorney, Agent, or Firm* — Winkle, PLLC (57) ABSTRACT

A device includes a number of fins. Some of the fins have greater heights than other fins. This allows the selection of different drive currents and/or transistor areas.

20 Claims, 8 Drawing Sheets

SUBSTRATE FINS WITH DIFFERENT HEIGHTS

CROSS REFERENCE TO RELATED APPLICATIONS

The present application is a continuation of U.S. patent application Ser. No. 12/215,778, entitled "SUBSTRATE FINS WITH DIFFERENT HEIGHTS" filed on Jun. 30, 2008.

BACKGROUND

Background of the Invention

Multi-gate devices such as transistors may be formed on fin structures. The gate channel "width" of such a multi-gate device may depend at least in part on the height of the fin.

BRIEF DESCRIPTION OF THE DRAWINGS

FIG. 14b is a cross-sectional side view that illustrates three transistors formed on the fins with three different heights of FIG. 14a.

DETAILED DESCRIPTION

Various embodiments of a substrate having fins of different heights are discussed in the following description. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative example representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order, in series or in parallel, than the described embodiment. Various additional operations may be performed and/or described operations may be omitted in additional embodiments.

Figure 1:
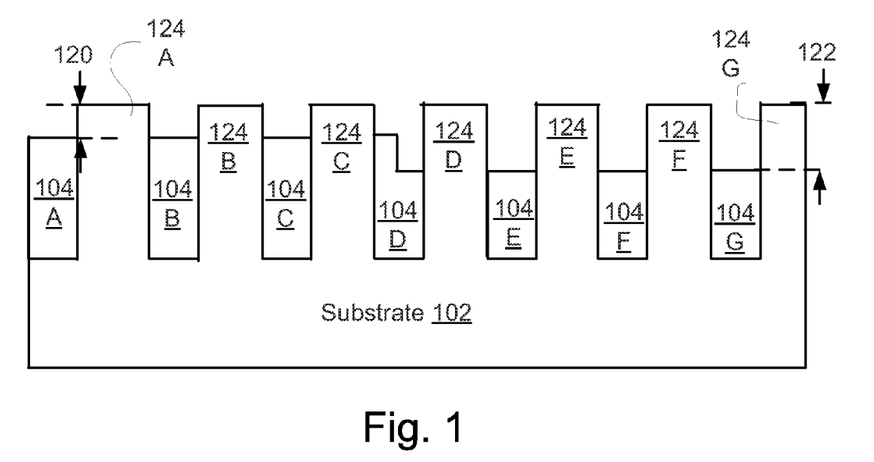
FIG. 1 is a cross sectional side view that illustrates a plurality of fins of different heights on the same substrate.

FIG. 1 is a cross sectional side view that illustrates a plurality of fins 124 of different heights on the same substrate 102, according to one embodiment of the described invention. This substrate 102 may comprise any material that may serve as a foundation upon which a semiconductor device may be built. In one example, substrate 102 comprises silicon, although another material or other materials may be used in other examples. The substrate 102 may be a portion of a bulk substrate, such as a wafer of single crystal silicon, a silicon-on-insulator (SOI) substrate 102 such as a layer of silicon on a layer of insulating material on another layer of silicon, a germanium substrate 102, a group III-V material (such as GaAs, InSb, InAl, etc.) substrate 102, may be a substrate 102 comprising multiple layers, or another type of substrate 102 comprising other material or materials.

Fins 124 have been formed on the substrate 102. Rather than all fins 124 having the same height, the fins 124 have differing heights above isolation regions 104. Fins 124A through 124C have a smaller height 120 while fins 124D through 124G have a larger height 122. This difference between heights 120 and 122 is selectable by choosing materials and etchants. In an embodiment, the greater height 122 is selected to be between a height roughly equal to the lower height 120 and a height about twice as great as the lower height 120 (i.e. height 120 is between 99% and 50% of height 122). In another embodiment, the greater height 122 may be more than twice the lower height 120. In an embodiment, the lower height 120 may be between 15-20 nanometers, and the greater height 122 30-40 nanometers, although the invention is not limited to fins 124 within those height ranges.

Such an ability to have fins 124 of different height allows multi-gate transistors to be made on the fins 124 with different desired properties. As the drive current of a transistor is dependent on the gate channel "width" of a multi-gate transistor, and the "width" may be made greater by use of a taller fin 124 without increasing the area of the transistor, selectable multi-height fins 124 allow the transistors with the same area to have selected drive currents based on the fin heights. In other embodiments, different areas of transistors may be selected without changing drive currents by selecting the fin heights. Rather than having one selectable parameter, transistor area, with which to affect drive currents, designers may independently select transistor height and area to achieve desired device characteristics.

FIGS. 2 through 9 are cross sectional side views that illustrate how fins 124 of different heights on the same substrate 102 may be formed according to one embodiment.

Figure 2:
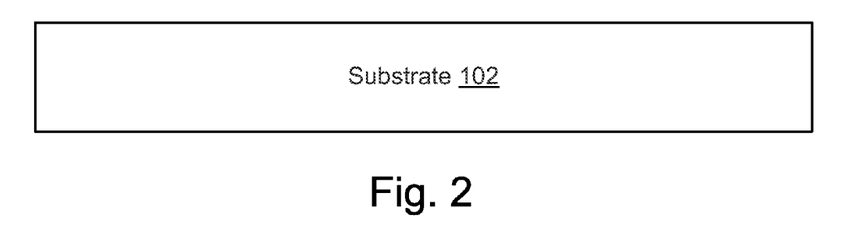
FIG. 2 is a cross sectional side view that illustrates the substrate.

FIG. 2 is a cross sectional side view that illustrates the substrate 102. As discussed above, the substrate 102 may comprise any material that may serve as a foundation upon which a semiconductor device may be built.

Figure 3:
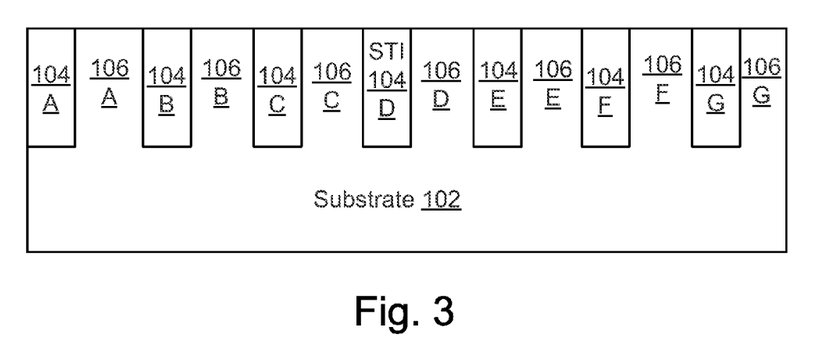
FIG. 3 is a cross sectional side view that illustrates the substrate after isolation regions have been formed.

FIG. 3 is a cross sectional side view that illustrates the substrate 102 after isolation regions 104 have been formed. These isolation regions 104 may be, for example, shallow trench isolation regions. Any suitable method for forming isolation regions 104 may be used, and the isolation regions 104 may comprise any suitable material. A suitable isolation region 104 material is one that may be selectively etched while leaving the substrate 102 material substantially intact. In one embodiment, the isolation regions 104 comprise a silicon oxide material and the substrate 102 comprises silicon. Other suitable isolation region materials include, for example, silicon dioxide (which may be deposited in a variety of processes), and spin-on glass (SOG), among others.

The formation of the isolation regions 104 also results in pre-fin regions 106 of the substrate 102. These pre-fin regions 106 are between the isolation regions 104.

Figure 4:
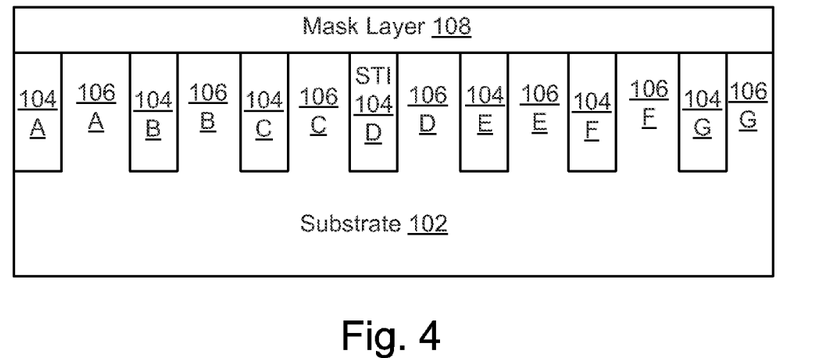
FIG. 4 is a cross sectional side view that illustrates a mask.

FIG. 4 is a cross sectional side view that illustrates a mask layer 108 formed on the substrate 102, isolation regions 104, and pre-fin regions 106. The mask layer 108 may be formed from a material that has an etch rate in a selected etchant within an order of magnitude of the etch rate of the isolation regions 104 in the selected etchant in one embodiment. In some embodiments, the mask layer 108 has an etch rate faster than the isolation regions 104 in the selected etchant. In some embodiments, the mask layer 108 has an etch rate that is twice the etch rate of the isolation regions 104 or less in the selected etchant. In some embodiments, the mask layer 108 has an etch rate that is one half the etch rate of the isolation regions 104 or more in the selected etchant. In one embodiment, the mask layer 108 comprises a silicon nitride material substantially free from oxygen and carbon. In other embodiments, the mask layer 108 may comprise a silicon nitride material with various amounts of oxygen and/or carbon present to modulate the etch rate, a SiC material, or other materials may also be used.

Figure 5:
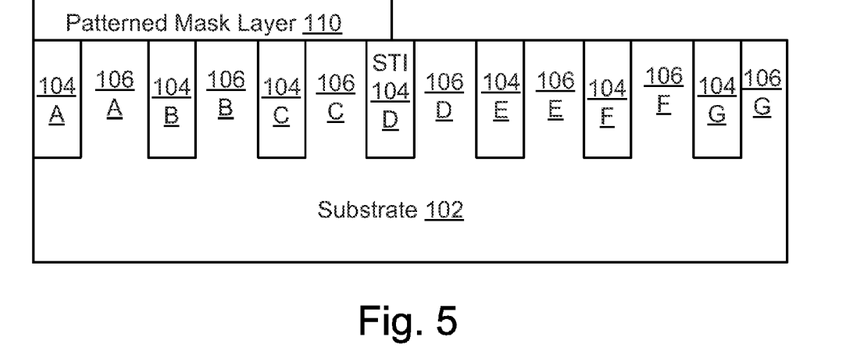
FIG. 5 is a cross-sectional side view that illustrates the patterned mask layer.

FIG. 5 is a cross-sectional side view that illustrates the patterned mask layer 110. Any suitable method may be used to pattern the mask layer 108 of FIG. 4 to result in the patterned mask layer 110. The patterned mask layer 110 remains over pre-fin regions 106A-106C, to protect them from part of the etching to come. Pre-fin regions 106D-106G are unprotected by the patterned mask layer 110. This will result in pre-fin regions 106A-106C becoming fins 124A-124C having a smaller height 120 than the height of fins 124D-124G that stem from pre-fin regions 106D-106G.

Figure 6:
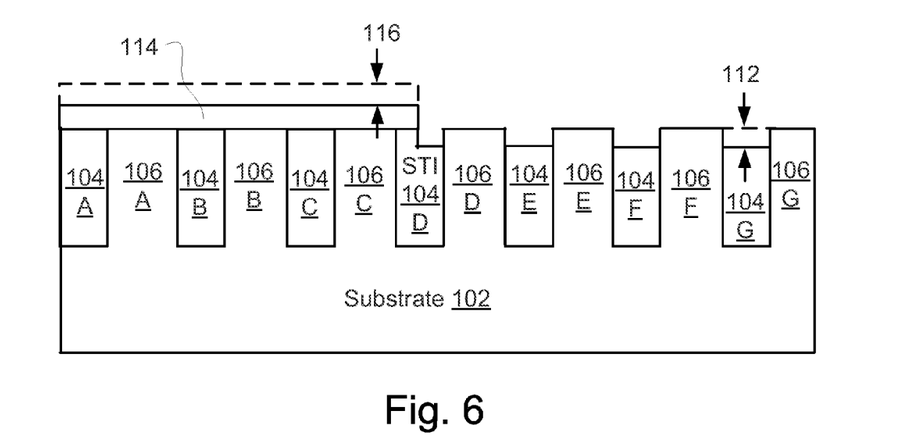
FIG. 6 is a cross-sectional side view that illustrates a time part way through an etching process that is used to form the fins.

FIG. 6 is a cross sectional side view that illustrates the patterned mask layer 110, the pre-fin regions 106, the isolation regions 104, and the substrate 102 part way through an etching process that is used to form the fins 124. In FIG. 6, part of the patterned mask layer 110 has been removed, leaving remaining partial mask layer 114. Thickness 116 of the patterned mask layer 110 has been removed. Also, a thickness 112 of the isolation regions 104 has been removed at this point in the etching process. The difference between thickness 112 and thickness 116 will depend upon the difference between the etch rates of mask layer 108 and isolation regions 104. In an embodiment where the mask layer 108 comprises a silicon nitride material, the isolation regions 104 comprise a silicon oxide material, and the substrate 102 and pre-fin regions 106 comprise silicon, the etchant chosen may be a hydrofluoric acid (HF). Different etchants and/or different materials may be used, selected based on the desired etchant rate difference between the mask layer 108 and the isolation regions 104, and the etch selectivity to etch the mask layer 108 and isolation regions 104 while leaving the substrate 102 and pre-fin regions 106 substantially intact. For example, spin-on dielectric films such as silicate or siloxane can be used as the mask layer 108 or the isolation regions 104, with HF or buffered HF as the etchant. Other combinations may also be used.

Figure 7:
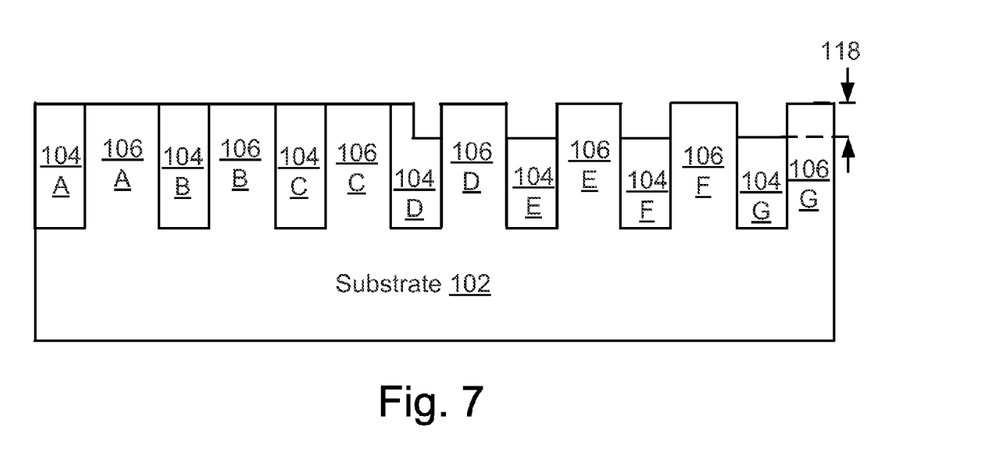
FIG. 7 is a cross-sectional side view that illustrates another time part way through an etching process that is used to form the fins.

FIG. 7 is a cross-sectional side view that illustrates the pre-fin regions 106, the isolation regions 104, and the substrate 102 at another time part way through an etching process that is used to form the fins 124. At the point illustrated in FIG. 7, all of the patterned mask layer 110 has been removed, and the isolation regions 104A-104C formerly protected by the patterned mask layer 110 are about to be etched. At this point, a thickness 118 of isolation regions 104E-104G, plus the portion of isolation region 104D adjacent pre-fin region 106D, have been removed. This thickness 118 sets the height differential (height 122 minus height 120) between the taller fins 124D-124G of FIG. 1, and the shorter fins 124A-124C of FIG. 1 (subject to small variations of the etching process). Thus, the thickness and etch rate of the material of the patterned mask layer 110 is chosen to provide the desired thickness 118, and the desired height differential between the fins 124 of FIG. 1. The etching process will continue after the point illustrated in FIG. 7 to remove portions of isolation regions 104A-104C and more of isolation regions 104D-104G and result in the fins 124 of FIG. 1.

FIG. 1, as mentioned above, is a cross sectional side view that illustrates the differently-heighted fins 124 resulting from the masking and etching process. The etching has continued past the point illustrated in FIG. 7 to remove portions of isolation regions 104A-104C, plus the left side of isolation region 104D, to form fins 124A-124C with a desired height 120. This continued etching has also removed more of isolation regions 104E-104G, plus the right side of isolation region 104D, to form fins 124D-124G with desired height 122. The mask layer 108 thickness is chosen based on the desired height differential 118 and the etch rate difference between the material of the mask layer 108 and the material of the isolation regions 104. The etch time is selected to etch through the patterned mask layer 110 and remove portions of isolation regions 104A-104C, plus the left side of isolation region 104D, to result in desired height 120 of fins 124A-124C.

Figure 8:
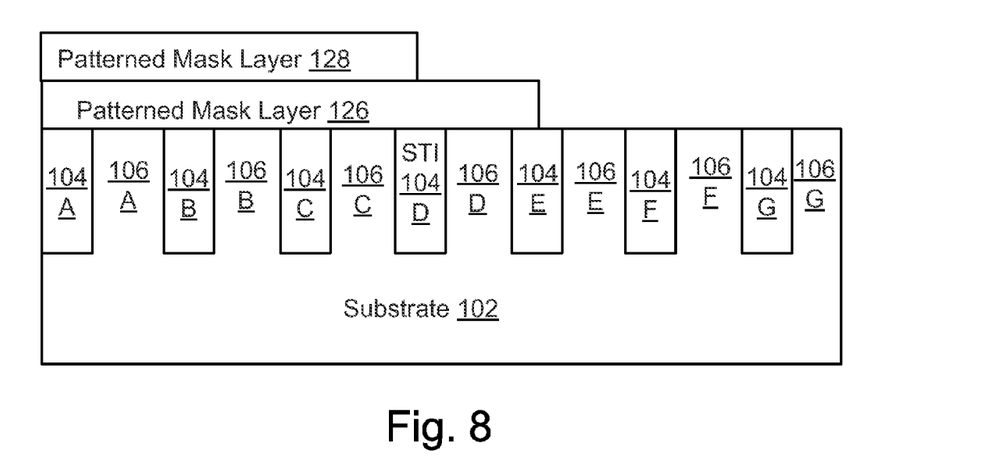
FIG. 8 is a cross-sectional side view that illustrates patterned mask layers that may be used to form fins having three different heights.

FIG. 8 is a cross-sectional side view that illustrates patterned mask layers 126, 128 that may be used to form fins 124 having three different heights. Isolation regions 104F, 104G, and the right side of isolation region 104E are not covered by a mask layer. Patterned mask layer 126 has been patterned to cover isolation regions 104A-104D, plus the left side of isolation region 104E. Patterned mask layer 128 has been patterned to cover isolation regions 104A-104C, plus the left side of isolation region 104D. When an etching process is performed, isolation regions 104F, 104G, and the right side of isolation region 104E will be etched from the start of the process. The right side of isolation region 104D and the left side of isolation region 104E will be etched after a delay caused by time it takes to remove patterned mask layer 126. Finally, the left side of isolation region 104D and isolation regions 104A-104C will be etched after a longer delay caused by the time it takes to remove both patterned mask layer 128 and patterned mask layer 126.

Figure 9:
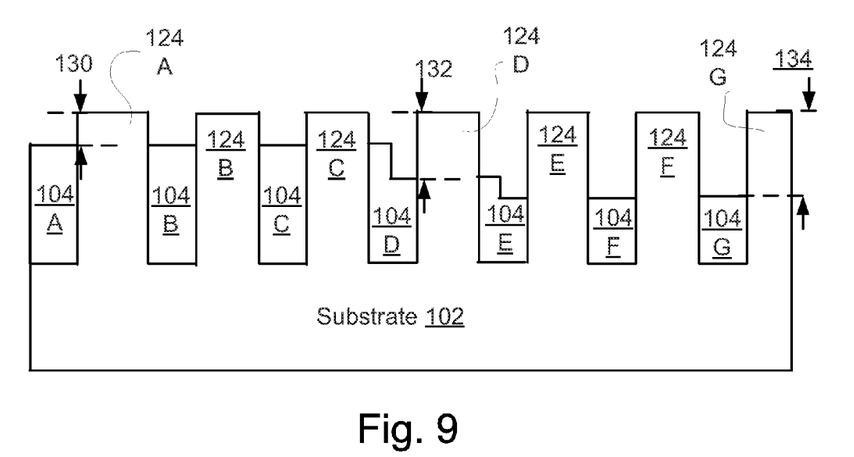
FIG. 9 is a cross-sectional side view that illustrates the fins resulting from the two different patterned mask layers illustrated in FIG. 8.

FIG. 9 is a cross-sectional side view that illustrates the fins 124 resulting from the two different patterned mask layers 126, 128 illustrated in FIG. 8. Because they were not covered by a mask layer, pre-fin regions 106E-106G became the fins 124E-124G with the greatest height 134. Because it was covered by only one patterned layer 126, pre-fin region 106D became fin 124D with a middle height 132. Because they were covered by two patterned mask layers 126, 128, pre-fin regions 106A-106C became fins 124A-124C with the shortest height 130.

The thickness of patterned mask layer 126 is selected based on the desired height differential between fin 124D and fins 124E-124G (i.e. height 134 minus height 132) and the etch rate difference between the material of the mask layer 126 and the material of the isolation regions 104. Similarly, the thickness of patterned mask layer 128 is selected based on the desired height differential between fins 124A-124C and fin 124D (i.e. height 132 minus height 130) and the etch rate difference between the material of the mask layer 128 and the material of the isolation regions 104.

Additional mask layers may be used to make yet other differences in the heights of fins 124 on a substrate. More than three different heights may be created. Rather than multiple stacked patterned mask layers 126, 128, there may be a first patterned mask layer with a first thickness covering some pre-fin regions 106, and a second patterned mask layer with a second thickness greater than the first thickness covering different pre-fin regions 106 than those covered by the first patterned mask layer. Alternatively, mask layers with different etch rates in an etchant may be used in place of, or in addition to, different thicknesses. No matter how many different heights are present in the final set of fins 124, the resulting fins 124 may be used in any application calling for such structures.

Figure 10:
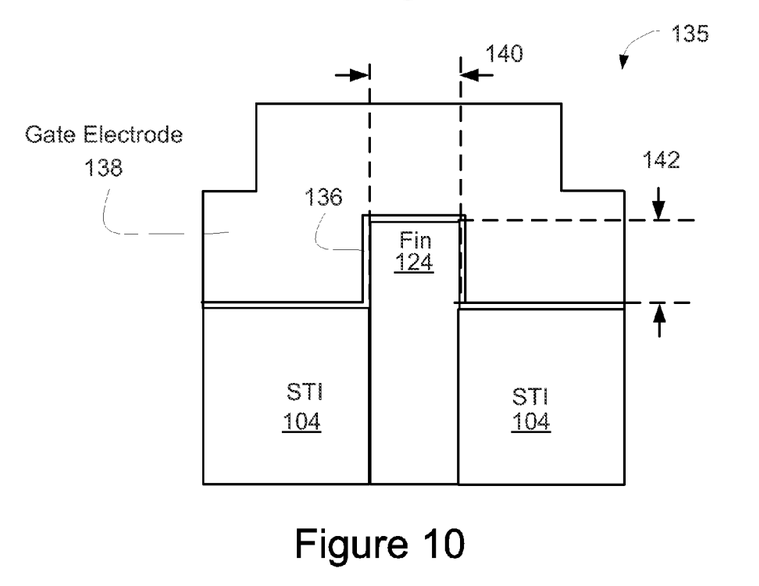
FIG. 10 is a cross-sectional side view that illustrates one application to which fins may be put: a multi-gate transistor.

FIG. 10 is a cross-sectional side view that illustrates one application to which fins 124 may be put: a multi-gate transistor 135. The illustrated embodiment of the multi-gate transistor 135 is a tri-gate transistor 135 that includes the fin 124 adjacent the isolation regions 104. There is a gate dielectric layer 136 adjacent the fin 124, and a gate electrode 138 adjacent the gate dielectric layer 136. As the gate electrode 138 is adjacent three sides of the fin 124, the gate channel "width" of the transistor 135 includes the fin 124 width 140 plus twice the fin 124 height 142 (this is why the term channel "width" as used herein has quotations; the "width" is not merely the width of the channel, but also includes other dimensions). As the drive current of the transistor 124 is at least partially dependent on the gate channel "width" of the transistor 135, the drive current may be increased by increasing the height 142 while leaving the other dimensions of the transistor 135 the same.

Figure 11:
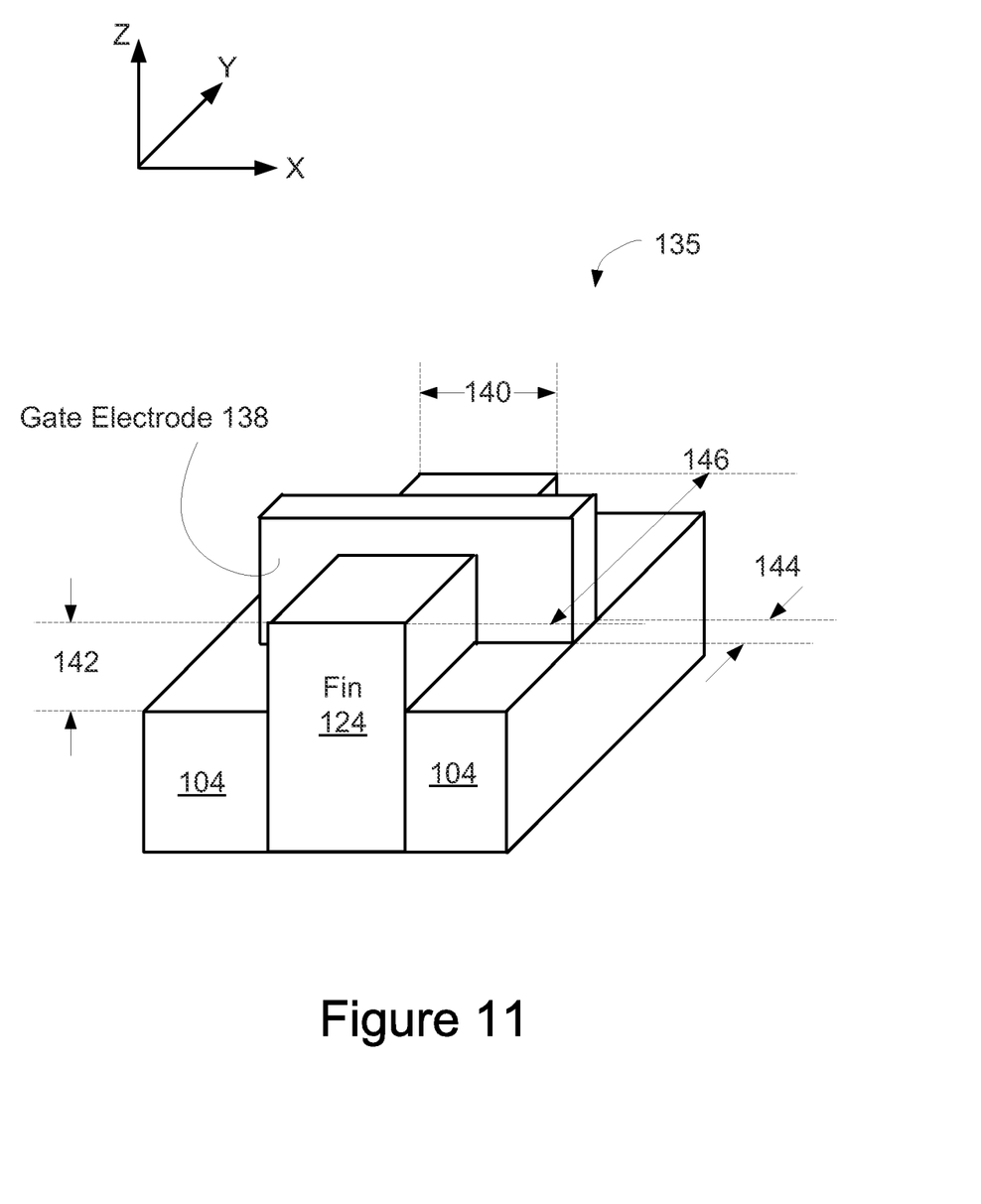
FIG. 11 is an isometric view that illustrates the transistor.

FIG. 11 is an isometric view that illustrates the transistor 135. As mentioned above, because the gate channel "width" is dependent on the height 142 of the fin 124, the drive current of the transistor 135 may be increased without increasing the fin 124 width 140 or the gate depth 144. This means that by increasing the height 142 of the fin 124, the drive current may be increased without the transistor 135 taking up more area. "Area" referring to area within the X-Y plane; note that in FIGS. 1-10, the X-axis goes from left to right in the plane of the picture, the Z-axis is up and down in the plane of the picture, and the Y-axis is normal to the plane of the picture. Thus, using the embodiment illustrated in FIG. 1, fins 124A-124C may be used to make multi-gate transistors 135 with lower drive current and fins 124D-124G used to make multi-gate transistors 135 with higher drive current, with the areas of each of the multi-gate transistors (in the X-Y plane) being substantially the same.

One application is to make NMOS (n-type metal oxide semiconductor transistors) and PMOS (p-type metal oxide semiconductor transistors) having substantially the same drive current while being closer in area compared to NMOS and PMOS transistors made on fins having equal heights. A PMOS transistor having the same gate channel "width" as an NMOS transistor will typically have a lower drive current. By increasing the fin 124 height 142 of the PMOS transistor compared to the NMOS transistor on the same substrate 102, the PMOS gate "width" can be increased, and the drive current increased, without increasing the area taken up by the PMOS transistor. Thus, the PMOS and NMOS transistors 135 on a substrate 102 may have substantially the same area and substantially the same drive current.

In other embodiments, the PMOS transistor 135 may have substantially the same area as the NMOS transistor 135 and the drive current of the PMOS transistor may be more or less than that of the NMOS transistor by selecting the fin heights of the respective transistor types. Alternatively, both the area and fin height 142 of the PMOS transistor may be selected to each be greater or less than the NMOS transistor based on the desired drive current for some specific circuit requirement and acceptable use of area on the substrate 102.

In yet other embodiments, the drive current of multiple instances of a single transistor type (either N- or P-type) may be varied across a single substrate 102 without changing their area by having different fin 124 heights 142. This may be useful, for example, when transistors 135 of the same area are desired (e.g. when design rules that dictate spacing of transistors are based on transistor area) yet different drive currents are desired. The area and height of the fin 124 may each be separately chosen by the device designer to result in a device such as a transistor having the desired drive current and area.

Figure 12:
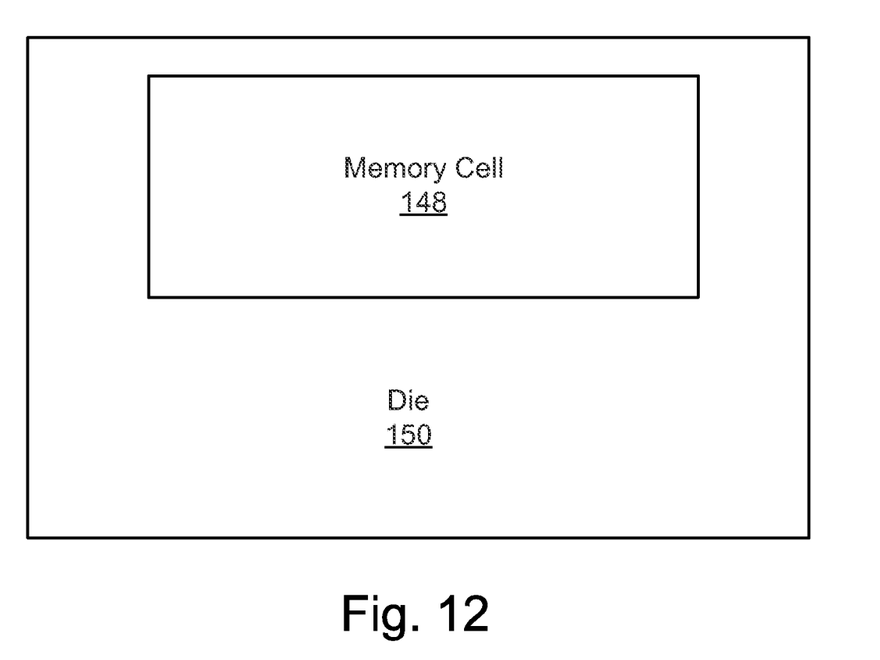
FIGS. 12 and 13 are block diagrams that illustrate applications in which the above-mentioned NMOS and PMOS transistors may be used.
Figure 13:
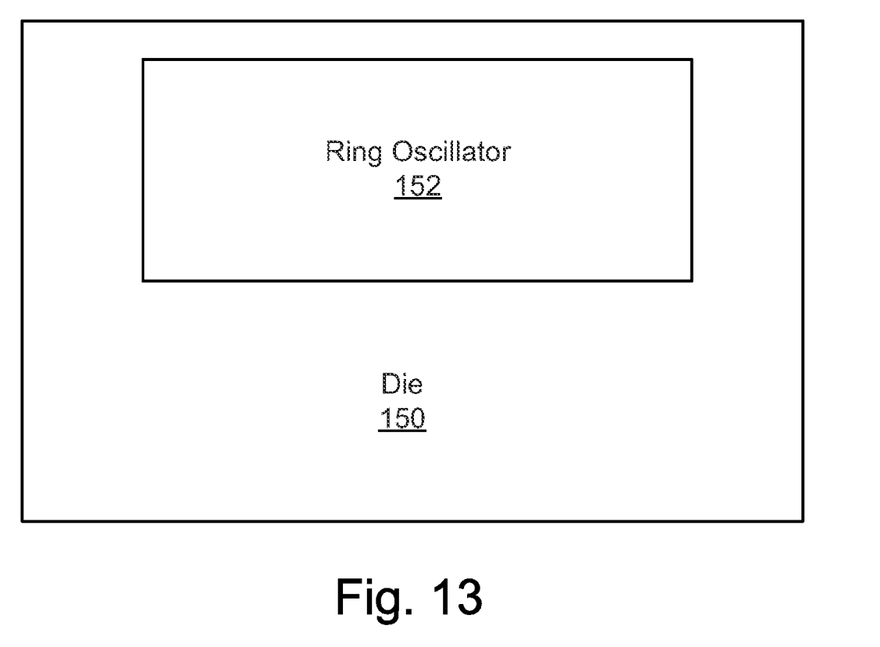

FIGS. 12 and 13 are block diagrams that illustrate applications in which the above-mentioned NMOS and PMOS transistors 135 may be used. FIG. 12 includes a die 150 and a memory cell 148 that is part of the die 150. The memory cell 148, which may be, for example, a SRAM cell 148, includes a number of both NMOS and PMOS multi-gate transistors 135. The PMOS transistors 135 have a taller fin 124 than the NMOS transistors 135 so that transistors 135 of both types have substantially the same area and substantially the same drive current. FIG. 13 includes a die 150 and a ring oscillator 152 that is part of the die 150. The ring oscillator 152 includes a number of both NMOS and PMOS multi-gate transistors 135. The PMOS transistors 135 have a taller fin 124 than the NMOS transistors 135 so that transistors 135 of both types have substantially the same area and substantially the same drive current. Numerous other examples of devices and circuits that would benefit from transistors 135 with different height 142 fins 124 are also possible.

Figure 14A:
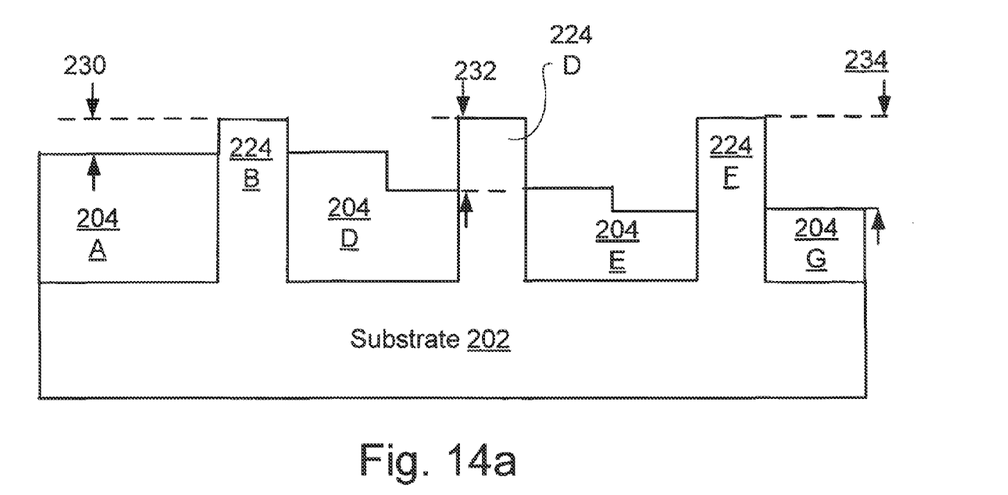
FIG. 14a is a cross-sectional side view that illustrates fins with three different heights resulting from the two different patterned mask layers illustrated in FIG. 8.

FIG. 14a is a cross-sectional side view that illustrates the fins 224 with three different heights resulting from the two different patterned mask layers 126, 128 illustrated in FIG. 8. For clarity, in FIGS. 14a and 14b only three fins 224B, 224D, and 224F separated by isolation regions 204A, 204D, 204E, and 204G on substrate 202 are shown. Because it was not covered by a mask layer, pre-fin regions 106F became the fin 224F with the greatest height 234. Because it was covered by only one patterned layer 126, pre-fin region 106D became fin 224D with a middle height 232. Because it was covered by two patterned mask layers 126, 128, pre-fin region 106B became fin 224B with the shortest height 230.

Figure 14B:
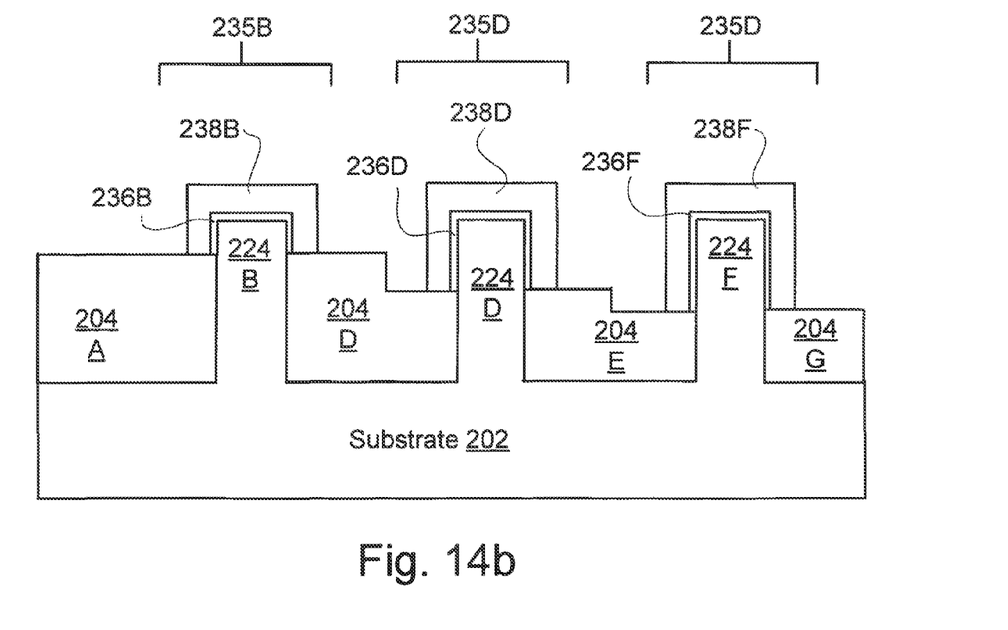

FIG. 14b is a cross-sectional side view that illustrates three transistors 235B, 235C, and 235D formed on the fins 224B, 224D, and 224F with three different heights of FIG. 14a. Transistors 235B, 235D, and 235F are similar to the transistors illustrated in FIGS. 10 and 11. Transistor 235B includes a gate dielectric region 236B and a gate electrode 238B. Similarly, transistor 235D includes a gate dielectric region 236D and a gate electrode 238D, and transistor 235F includes a gate dielectric region 236F and a gate electrode 238F.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed:

1. A semiconductor device, comprising:
   a substrate;
   a first multi-gate transistor on a first portion of the substrate, the first multi-gate transistor comprising a first fin, the first fin having a first height above a first isolation region;
   a second multi-gate transistor on a second portion of the substrate, the second multi-gate transistor comprising a second fin, the second fin having a second height above a second isolation region, the second height being greater than the first height;
   wherein the first isolation region has a first depth adjacent the first fin, there is a transition down to the second isolation region having a second lower depth adjacent the second fin, and there is no isolation region directly between the first fin and second fin that has a depth substantially higher than the first depth; and
   wherein there is no third multi-gate transistor directly between the first and second multi-gate transistors.

2. The device of claim 1 wherein the first and second isolation regions are regions of a single continuous isolation material layer that extends from the first multi-gate transistor to the second multi-gate transistor.

3. The device of claim 1, wherein the isolation material layer has a top surface that extends substantially laterally and horizontally from the first multi-gate transistor to the transition, extends downward toward the substrate at the transition, and extends substantially laterally and horizontally from the transition to the second multi-gate transistor.

4. The device of claim 1, wherein the isolation regions comprise silicon dioxide.

5. The device of claim 1, wherein the first multi-gate transistor is an N-type transistor and the second multi-gate transistor is a P-type transistor.

6. The device of claim 5, further comprising a memory cell, wherein both the first and second multi-gate transistors are transistors of the memory cell.

7. The device of claim 5, further comprising a ring oscillator, wherein both the first and second multi-gate transistors are transistors of the ring oscillator.

8. The device of claim 5 wherein the second height is greater than the first height in an amount great enough that a drive current of the first transistor is within 10% of a drive current of the second transistor.

9. The device of claim 8 wherein the first multi-gate transistor has a first area, the second multi-gate transistor has a second area, and the first area is within about 15% of the second area.

10. The device of claim 1 wherein the second height is at least 25% greater than the first height.

11. A semiconductor device, comprising:
    a substrate;
    a first multi-gate transistor on a first portion of the substrate, the first multi-gate transistor comprising a first fin;
    a second multi-gate transistor on a second portion of the substrate, the second multi-gate transistor comprising a second fin;
    an isolation region between the first multi-gate transistor and the second multi-gate transistor, the isolation region having a first depth adjacent the first multi-gate transistor, and a second depth lower than the first depth adjacent to the second multi-gate transistor, none of the isolation region between the first and second transistors being substantially above the first depth; and
    wherein a transition between the first depth and second depth is not located directly adjacent a multi-gate transistor.

12. The device of claim 11 wherein the first fin has a first height above the isolation region, and the second fin has a second height above the isolation region, and the second height is greater than the first height.

13. The device of claim 11 wherein the isolation region is adjacent a first side of the first multi-gate transistor, there is a second isolation region adjacent a second side of the first multi-gate transistor, and the second isolation region has substantially the same first depth adjacent the second side of the first multi-gate transistor as the first depth of the isolation region adjacent the first side of the first multi-gate transistor.

14. The device of claim 13 wherein the isolation region is adjacent a first side of the second multi-gate transistor, there is a third isolation region adjacent a second side of the second multi-gate transistor, and the third isolation region has substantially the same second depth adjacent the second side of the second multi-gate transistor as the second depth of the isolation region adjacent the first side of the second multi-gate transistor.

15. The device of claim 11 wherein the first fin has a first height above the isolation region, and the second fin has a second height above the isolation region, and the second height is at least 25% greater than the first height.

16. A semiconductor device, comprising:
    a substrate;
    a first multi-gate transistor on a first portion of the substrate, the first multi-gate transistor comprising a first fin, the first fin having a first height above isolation material adjacent to a first and a second side of the first fin;

a second multi-gate transistor on a second portion of the substrate, the second multi-gate transistor comprising a second fin, the second fin having a second height greater than the first height above isolation material adjacent to a first and a second side of the second fin; and wherein isolation material extends from the first fin to the second fin and none of the isolation material directly between the first and second fin extends substantially above the isolation material directly adjacent the first fin.

17. The device of claim 16 wherein the isolation material between the first fin and the second fin has a first height adjacent the first fin, a lower second height adjacent the second fin, and a transition region where it transitions from the first height to the second height.

18. The device of claim 16, further comprising a third multi-gate transistor on a third portion of the substrate, the third multi-gate transistor comprising a third fin, the third fin having a third height substantially the same as the second height above isolation material adjacent to a first and a second side of the third fin, and wherein the first fin has a first top, the second fin has a second top, and the third fin has a third top, the first, second and third tops being substantially coplanar.

19. The device of claim 16, wherein the first multi-gate transistor is an N-type transistor and the second multi-gate transistor is a P-type transistor.

20. The device of claim 19 wherein the second height is greater than the first height in an amount great enough that a drive current of the first transistor is within 10% of a drive current of the second transistor.

* * * * *